United States Patent
Gulati et al.

(10) Patent No.: US 9,659,616 B2
(45) Date of Patent: May 23, 2017

(54) CONFIGURATION FUSE DATA MANAGEMENT IN A PARTIAL POWER-ON STATE

(71) Applicant: Apple Inc., Cupertino, CA (US)

(72) Inventors: Manu Gulati, Saratoga, CA (US); Erik P. Machnicki, San Jose, CA (US); Gilbert H. Herbeck, Livermore, CA (US)

(73) Assignee: Apple Inc., Cupertino, CA (US)

( * ) Notice: Subject to any disclaimer, the term of this patent is extended or adjusted under 35 U.S.C. 154(b) by 191 days.

(21) Appl. No.: 14/459,466

(22) Filed: Aug. 14, 2014

(65) Prior Publication Data

US 2016/0049207 A1    Feb. 18, 2016

(51) Int. Cl.
| | |
|---|---|
| *G11C 17/16* | (2006.01) |
| *G11C 7/20* | (2006.01) |
| *G11C 29/04* | (2006.01) |
| *G11C 29/44* | (2006.01) |

(52) U.S. Cl.
CPC ........... *G11C 7/20* (2013.01); *G11C 17/16* (2013.01); *G11C 2029/0407* (2013.01); *G11C 2029/4402* (2013.01)

(58) Field of Classification Search
CPC ....... G11C 17/16; G11C 17/165; G11C 17/18; G11C 7/20; G11C 2029/0407; G11C 2029/4402; G06F 9/24; G06F 17/00
See application file for complete search history.

(56) References Cited

U.S. PATENT DOCUMENTS

| | | | |
|---|---|---|---|
| 7,152,187 B2 | 12/2006 | Tran et al. | |
| 7,623,403 B2 | 11/2009 | Cha et al. | |
| 7,656,695 B2 | 2/2010 | Rahman | |
| 8,775,880 B2* | 7/2014 | Singh ................. | G11C 29/4401 714/710 |
| 9,136,012 B1* | 9/2015 | Kasorla .................. | G11C 17/18 |
| 2005/0076274 A1* | 4/2005 | Nagai ................. | G06F 11/1008 714/718 |
| 2007/0109882 A1* | 5/2007 | Taniguchi ............ | G11C 29/789 365/200 |
| 2009/0199058 A1* | 8/2009 | Seidl .................. | G11C 16/3418 714/719 |
| 2015/0200020 A1* | 7/2015 | Jothikumar ............ | G11C 17/18 365/96 |

* cited by examiner

*Primary Examiner* — Fahmida Rahman
(74) *Attorney, Agent, or Firm* — Meyertons, Hood, Kivlin, Kowert & Goetzel, P.C.

(57) ABSTRACT

In an embodiment, an apparatus may include a plurality of circuit blocks, a plurality of fuses and circuitry. The circuitry may be configured to determine a state for each of the plurality of fuses in response to transitioning from an off mode to a first operating mode. A first number of circuit blocks may be enabled in the first operating mode. The circuitry may also be configured to initialize the first number of circuit blocks dependent upon the states of one or more of the plurality of fuses and to transition from the first operating mode to a second operating mode. A second number of circuit blocks, less than the first number, may be enabled in the second operating mode. The circuitry may also be configured to store data representing the states of a subset of the plurality of fuses into a first memory enabled in the second operating mode.

20 Claims, 8 Drawing Sheets

CONFIGURATION FUSE DATA MANAGEMENT IN A PARTIAL POWER-ON STATE

BACKGROUND

Technical Field

Embodiments described herein are related to the field of systems-on-a-chip (SoCs) and, more particularly, to configuration fuses in an SoC.

Description of the Related Art

A variety of electronic devices are now in daily use with consumers. Particularly, mobile devices have become ubiquitous. Mobile devices may include cell phones, personal digital assistants (PDAs), smart phones that combine phone functionality and other computing functionality, tablets, laptops, net tops, smart watches, wearable electronics, etc. Generally, a mobile device may be any electronic device that is designed to be carried by a user or worn by a user. The mobile device is typically battery powered so that it may operate away from a constant electrical source such as an electrical outlet.

Many mobile devices may operate in a "standby" mode much of the time. In the standby mode, the device may appear to be "off," in as much as the device is not actively displaying content for the user and/or not actively performing functionality for the user. In the standby mode, much of the device may indeed be powered off. In the background, however, the device may be polling voice and data networks, checking for alarms, reacting to movement, etc.

Because mobile devices are often operating from a limited power supply (e.g. a battery), energy conservation is a key design consideration for the devices. A mobile device may include a system-on-a-chip (SoC) as an aid in energy conservation, since much of the functionality needed in the device can be included in the SoC. In "standby" or other low power modes, it is desirable to power down the SoC to eliminate leakage current losses, which are a significant factor in energy consumption in modern integrated circuit technologies.

Some circuits in an SoC may require initialization before they can be fully utilized. In some cases, initialization information may be stored in a non-volatile memory, such as flash, for example, within the system and the SoC may read the information and initialize corresponding circuits accordingly. Some circuits, however, may need to be initialized before an available non-volatile memory is capable of being read. In such cases, one or more configuration fuses may be included within the SoC and used as a non-volatile memory to store initialization information.

When an SoC transitions into reduced power modes, some circuitry of the SoC may be disabled as part of the power reduction. Disabling circuits may result in configuration information for the circuits being reset and requiring re-initializing when the circuits are enabled. Re-initializing the circuits may require reading fuse values to get the initialization information.

SUMMARY

In an embodiment, an apparatus may include a plurality of circuit blocks, a plurality of fuses and circuitry. The circuitry may be configured to determine a state for each fuse of the plurality of fuses in response to transitioning from an off mode to a first operating mode. A first number of circuit blocks may be enabled in the first operating mode. The circuitry may also be configured to initialize the first number of circuit blocks dependent upon the states of one or more fuses of the plurality of fuses and to transition from the first operating mode to a second operating mode. A second number of circuit blocks, less than the first number of circuit blocks, may be enabled in the second operating mode. The circuitry may also be configured to store data representative of the states of a subset of the plurality of fuses into a first memory enabled in the second operating mode. The states of the subset of the plurality of fuses may be associated with the second number of circuit blocks.

In a further embodiment, the circuitry may be further configured to transition from the second operating mode to a third operating mode. A third number of circuit blocks of the plurality of circuit blocks, less than the second number of circuit blocks, may remain enabled in the third operating mode. The first memory may be enabled in the third operating mode.

In a still further embodiment, the circuitry may be further configured to transition from the third operating mode back to the second operating mode and to initialize the second number of circuit blocks dependent upon the stored data representative of the state of the subset of the plurality of fuses.

In another embodiment, at least two circuit blocks of the plurality of circuit blocks may comprise a second memory, and at least one circuit block of the second number of circuit blocks may include a subset of a plurality of memory arrays included in the second memory. In a further embodiment, at least a portion of the stored data representative of the state of the subset of the plurality of fuses may include data associated with repairing the subset of the plurality of memory arrays.

In one embodiment, at least one circuit block of the second number of circuit blocks may include at least one sensor. To initialize the second number of circuit blocks, the circuitry may be further configured to calibrate the at least one sensor dependent upon at least a portion of the stored data representative of the state of the subset of the plurality of fuses responsive to transitioning from the third operating mode to the second operating mode.

In another embodiment, at least one circuit block of the second number of circuit blocks may include a clock source. To initialize the second number of circuit blocks, the circuitry may be further configured to calibrate the clock source dependent upon at least a portion of the stored data representative of the state of the subset of the plurality of fuses responsive to transitioning from the third operating mode to the second operating mode.

BRIEF DESCRIPTION OF THE DRAWINGS

The following detailed description makes reference to the accompanying drawings, which are now briefly described.

While the embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112(f) interpretation for that unit/circuit/component.

This specification includes references to "one embodiment" or "an embodiment." The appearances of the phrases "in one embodiment" or "in an embodiment" do not necessarily refer to the same embodiment, although embodiments that include any combination of the features are generally contemplated, unless expressly disclaimed herein. Particular features, structures, or characteristics may be combined in any suitable manner consistent with this disclosure.

DETAILED DESCRIPTION OF EMBODIMENTS

In some embodiments of an SoC, configuration fuses may be used to store initialization information for one or more circuit blocks within the SoC. Fuses may consist of a strip of metal or other suitable electrically conducting material used in a semiconductor fabrication process, and coupled into a sensing circuit such that when the strip of metal is whole (i.e., forms a closed circuit), the sensing circuit reads one logic value and when the strip of metal is broken (i.e., open circuit, also referred to herein as blown) the sensing circuit reads the opposite logic value. In various embodiments, a blown fuse may read as a logic high and an unblown fuse may read as a logic low, vice-versa, or a combination of the two. Configuration fuses may be included within an SoC design and may be programmed by several methods, including by applying a high voltage or high current across the metal strip, causing the strip to heat and break. Another method is to vaporize at least a portion of the metal strip by focusing a laser beam on it. In some embodiments, fuses may be programmed before the die is packaged. In other embodiments, fuses may be programmed after the SoC has been added to a system.

When an SoC transitions from a reduced power mode into a more functional mode, one or more circuit blocks that are disabled in the reduced power mode may be enabled and some of these circuit blocks may require re-initialization using information stored in the configuration fuses. Re-initializing these circuit blocks may require re-reading fuse values to get the initialization information. Frequent reading of fuses, however, may physically stress the fuses, potentially contributing to long-term reliability issues.

It is noted that a "circuit block" may herein refer to any portion of a circuit or circuitry of an integrated circuit. As used herein, "a circuit block," "circuitry," and "a circuit" may be used interchangeably.

Reading a state of a fuse may require more time than reading a register or other type of memory. Consequently, when transitioning between operating modes, some latency may be encountered if fuses need to be read to reconfigure circuit blocks due to the mode transition. This latency may have a negative impact on performance by delaying actions of the SoC. Product designers, therefore, may rely less on reduced power modes to improve performance and reliability of their systems. To increase the usability of reduced power modes, it may be desirable to minimize the time required to exit the reduced power mode and transition to a more functional operating mode. In order to make reduced power modes a more viable solution, it may be desirable to minimize the latency when exiting these modes. Systems and methods are disclosed within for reducing latency associated with re-initializing circuit blocks due to mode transitions by reducing a number of read accesses to fuses.

Figure 1:
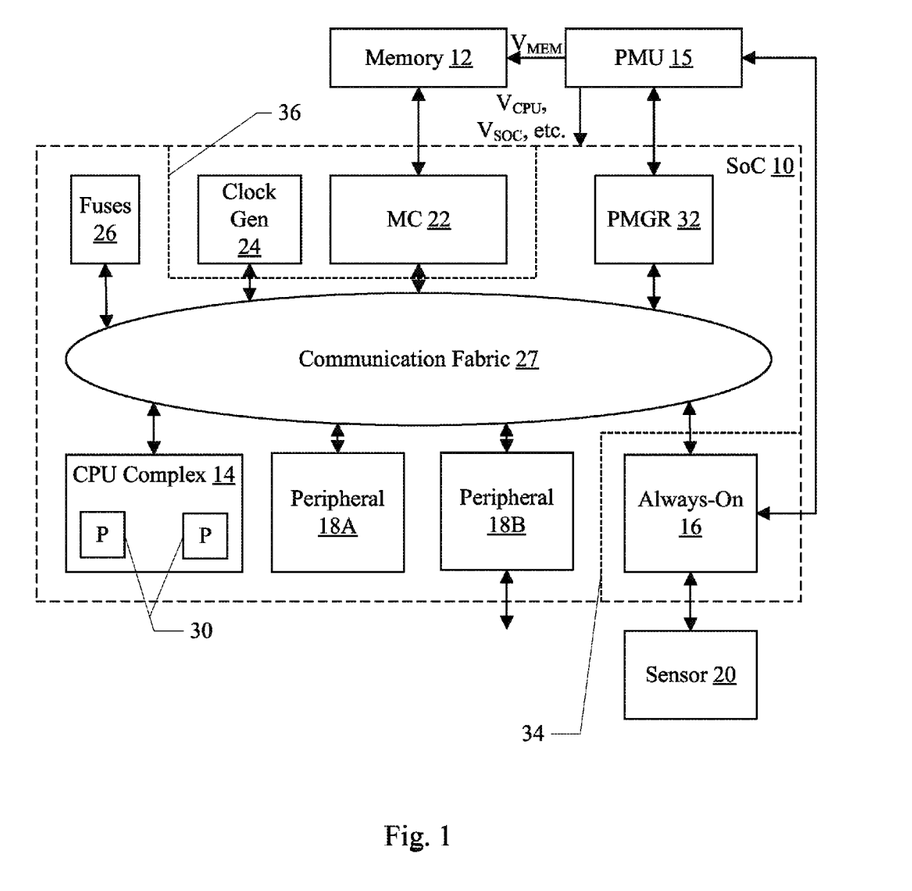
FIG. 1 is a block diagram of one embodiment of an SoC.

Turning now to FIG. 1, a block diagram of one embodiment of SoC 10 is shown coupled to memory 12, sensor 20, and power management unit (PMU) 15. The components of SoC 10 may be integrated onto a single semiconductor substrate as an integrated circuit "chip." In other embodiments, the components may be implemented on two or more discrete chips in a system. In the illustrated embodiment, the components of SoC 10 include central processing unit (CPU) complex 14, "always-on" component 16, peripheral components 18A-18B (more briefly, "peripherals"), memory controller (MC) 22, clock generation unit (clock gen) 24, fuses 26, power manager (PMGR) 32, and communication fabric 27. The components 14, 16, 18A-18B, 22, 24, 26, and 32 may all be coupled to communication fabric 27. Memory controller 22 may be coupled to memory 12 during use. PMGR 32 and always-on component 16 may be coupled to PMU 15. PMU 15 may be configured to supply various power supply voltage to SoC 10, memory 12, and/or sensor 20. Always-on component 16 may be coupled to sensor 20. In the illustrated embodiment, CPU complex 14 may include one or more processors (P 30 in FIG. 1). The processors 30 may form the CPU(s) of SoC 10.

Always-on component 16 may be configured to remain powered up when other components of SoC 10 (e.g. CPU complex 14, peripherals 18A-18B, and PMGR 32) are powered down. More particularly, always-on component 16 may be on whenever SoC 10 is receiving power from PMU 15. Thus, always-on component 16 is "always-on" in the sense that it may be powered if SoC 10 is receiving any power (e.g. at times when the device including SoC 10 is in standby mode or is operating actively), but may not be powered when SoC 10 is not receiving any power (e.g. at times when the device is completely turned off). Always-on component 16 may support certain functions while the remainder of SoC 10 is off, allowing low power operation.

In FIG. 1, dotted line 34 separating always-on component 16 from the other components may indicate an independent power domain for always-on component 16. Similarly, in the illustrated embodiment, dotted line 36 may represent another independent power domain for memory controller 22 and clock gen 24. Other components, groups of components, and/or subcomponents may have independent power domains as well. Generally, a power domain may be configured to receive supply voltage (i.e. be powered on) or not receive supply voltage (i.e. be powered off) independent of other power domains. In some embodiments, power domains may be supplied with different supply voltage magnitudes concurrently. This independence may be implemented in a variety of fashions. For example, the independence may be implemented by providing separate supply voltage inputs from PMU 15, by providing power switches between the supply voltage inputs and components and controlling the power switches for a given domain as a unit, and/or a combination of the above. There may be more power domains than those illustrated in FIG. 1 as well. For example, CPU complex 14 may have an independent power domain (and each CPU processor 30 may have an independent power domain as well) in one embodiment. Peripheral components 18A-18B may be in one or more independent power domains in other embodiments.

As illustrated in FIG. 1, always-on component 16 may be coupled to sensor 20 (and may be coupled to other sensors not illustrated). Always-on component 16 may be configured to read the sensor data from sensor 20 while SoC 10 is powered off (in addition to the times when SoC 10 is powered on). Always-on component 16 may include a memory (not shown in FIG. 1) to buffer the sensor data, and the remainder of SoC 10 need not be powered up unless the memory (or a portion thereof allocated to store sensor data) fills with data (or reaches a threshold level of fullness). In some embodiments, always-on component 16 may be configured to process the sensor data in some fashion as well. For example, always-on component 16 may be configured to filter the sensor data. Filtering data may generally refer to one or more of: searching for a pattern or other data properties that indicate that the sensor data should be further processed by the processors in CPU complex 14; manipulating the data to detect/remove noise in the data; further processing data that appears to match a pattern or other property to eliminate false positive matches; etc.

Sensor 20 may be any device that is configured to detect or measure aspects of the physical environment of a device that includes the sensor. For example, a sensor may include an accelerometer, which measures acceleration of the device. An accelerometer may be directional (measuring acceleration in a predetermined direction) or vector (measuring acceleration in multiple dimensions and producing a vector indicating the acceleration and its direction). Multiple directional accelerometers may be employed to permit vector acceleration sensing as well as directional acceleration sensing. Another example of a sensor may be gyroscope (or gyro). The gyroscope may be used to detect the orientation of the device and/or changes in orientation. Like the accelerometer, the gyroscope may be directional or multidimensional, and/or multiple directional gyroscopes may be used. Yet another sensor may be a magnetometer, which may be used to measure magnetic orientation and thus may be used to form a compass. In other embodiments, the compass functionality may be embedded in the sensor. Another sensor may be an audio detector (e.g. a microphone). The audio detector may capture sound and generate data indicative of the sound. Another sensor may be a photodetector that detects light or other electromagnetic energy. Other exemplary sensors may include an altimeter to detect altitude, a temperature sensor, and/or a pressure sensor. Still another sensor may be a user interface device such as a button, a touch screen, a keyboard, a pointing device, a camera, etc. Any set of sensors may be employed.

As mentioned above, always-on component 16 may be configured to buffer data in a memory within the component. If the buffer is nearing full, always-on component 16 may be configured to wake memory controller 22 in order to write the sensor data to memory 12. In some embodiments, always-on component 16 may be configured to write results of filtering the data to memory 12. In some embodiments, always-on component 16 may perform other processing tasks while the rest of SoC 10 is powered down. To the extent that these tasks access memory 12, always-on component 16 may be configured to wake memory controller 22. In addition, always-on component 16 may be configured to wake at least a portion of communication fabric 27 (i.e. the portion that connects always-on component 16 to memory controller 22).

Using this memory-only communication mode, always-on component 16 may be able to access memory 12 and take advantage of the significant storage available in memory 12 while expending a relatively low amount of energy/power, since the remainder of SoC 10 remains powered down. Always-on component 16 may store programmable configuration data for memory controller 22, so that always-on component 16 may program memory controller 22 once power is restored. That is, always-on component 16 may be configured to program memory controller 22 in a manner similar to the way the operating system would program memory controller 22 during boot of the device including SoC 10. The programmable configuration data stored by the always-on component 16 may be the configuration data that was in memory controller 22 when SoC 10 (except for always-on component 16) was most recently powered down, in one embodiment. In another embodiment, the programmable configuration data may be a configuration that is known to work for any previous configuration of memory controller 22 and/or any configuration of memory 12. The known-good configuration may, e.g., be a configuration that is acceptable in performance for the memory accesses by always-on component 16.

When SoC 10 is powered down with always-on component 16 remaining powered, part of the power down sequence may be to place memory 12 in a retention mode. For example, for dynamic random access memory (DRAM) embodiments of memory 12, the retention mode may be a "self-refresh" mode. In retention mode, memory 12 may not be externally accessible until the mode is changed. However, the contents of memory 12 may be preserved. For example, in the self-refresh mode, the DRAM may perform the periodic refreshes needed to retain data (which are normally performed by memory controller 22, when memory controller 22 is powered on).

In some embodiments, always-on component 16 may further store programmable configuration data for other components in SoC 10. The programmable configuration data may reflect the state of the components at the time that the remainder of SoC 10 was most recently powered down. Always-on component 16 may be configured to wake SoC 10 for processing, and may reprogram the components with the stored programmable configuration data. The process of restoring state to the components based on the stored programmable configuration data may be referred to as reconfiguration. Again, similar to the memory-only communication mode discussed above, the state that is restored to the components may be the state at the most recent power down of the component or may be a known-good state with acceptable performance for restarting SoC 10 for operation. In the latter case, the state may be modified to a higher performance state after the reconfiguration has completed.

Restoring state using the reconfiguration functionality in always-on component 16 may be a lower latency operation than restoring power in SoC 10, retrieving configuration information from a non-volatile memory such as, e.g., fuses 26 and then initializing SoC 10 and the operating system in a manner similar to a cold boot. During an initialization without always-on component 16, the operating system may discover that SoC 10 was previously powered down with system state stored in memory 12, and may then bypass some initialization operations. However, the latency of the restore may be greater than desired. Additional details for one embodiment are discussed in more detail below.

Always-on component 16 may be configured to communicate with PMU 15, in addition to the communication of the PMGR 32 to PMU 15. The interface between PMU 15 and always-on component 16 may permit always-on component 16 to cause components to be powered up (e.g. memory controller 22, or the other components of SoC 10) when PMGR 32 is powered down. The interface may also permit always-on component 16 to control its own power state as well.

Generally, a component may be referred to as powered on or powered off. The component may be powered on if it is receiving supply voltage so that it may operate as designed. If the component is powered off, then it is not receiving the supply voltage and is not in operation. The component may also be referred to as powered up if it is powered on, and powered down if it is powered off. Powering up a component may refer to supplying the supply voltage to a component that is powered off, and powering down the component may refer to terminating the supply of the supply voltage to the component. Similarly, any subcomponent and/or SoC 10 as a whole may be referred to as powered up/down, etc. A component may be a predefined block of circuitry which provides a specified function within SoC 10 and which has a specific interface to the rest of SoC 10. Thus, always-on component 16, peripherals 18A-18B, and CPU complex 14, memory controller 22, and PMGR 32 may each be examples of a component.

A component may be active if it is powered up and not clock gated. Thus, for example, a processor in CPU complex 14 may be available for instruction execution if it is active. A component may be inactive if it is powered off or in another low power state in which a significant delay may be experienced before instructions may be executed. For example, if the component requires a reset or a relock of a phase lock loop (PLL), it may be inactive even if it remains powered. A component may also be inactive if it is clock gated. Clock gating may refer to techniques in which the clock to the digital circuitry in the component is temporarily "turned off," preventing state from being captured from the digital circuitry in clocked storage devices such as flops, registers, etc.

As mentioned above, CPU complex 14 may include one or more processors 30 that may serve as the CPU of SoC 10. The CPU of the system includes the processor(s) that execute the main control software of the system, such as an operating system. Generally, software executed by the CPU during use may control the other components of the system to realize the desired functionality of the system. The processors may also execute other software, such as application programs. The application programs may provide user functionality, and may rely on the operating system for lower-level device control, scheduling, memory management, etc. Accordingly, the processors may also be referred to as application processors. CPU complex 14 may further include other hardware such as an L2 cache and/or an interface to the other components of the system (e.g. an interface to communication fabric 27).

An operating point may refer to a combination of power supply voltage magnitude and operating frequency for CPU complex 14, always-on component 16, other components of SoC 10, etc. The operating frequency may be the frequency of the clock that clocks the component. The operating frequency may also be referred to as the clock frequency or simply the frequency. The operating point may also be referred to as an operating state or power state. The operating point may be part of the programmable configuration data that may be stored in always-on component 16 and reprogrammed into the components when reconfiguration occurs.

Generally, a processor may include any circuitry and/or microcode configured to execute instructions defined in an instruction set architecture implemented by the processor. Processors may encompass processor cores implemented on an integrated circuit with other components as a system on a chip (SoC 10) or other levels of integration. Processors may further encompass discrete microprocessors, processor cores and/or microprocessors integrated into multichip module implementations, processors implemented as multiple integrated circuits, etc.

Memory controller 22 may generally include the circuitry for receiving memory operations from the other components of SoC 10 and for accessing memory 12 to complete the memory operations. Memory controller 22 may be configured to access any type of memory 12. For example, memory 12 may be static random access memory (SRAM), dynamic RAM (DRAM) such as synchronous DRAM (SDRAM) including double data rate (DDR, DDR2, DDR3, DDR4, etc.) DRAM. Low power/mobile versions of the DDR DRAM may be supported (e.g. LPDDR, mDDR, etc.). The memory controller 22 may include queues for memory operations, for ordering (and potentially reordering) the operations and presenting the operations to memory 12. The memory controller 22 may further include data buffers to store write data awaiting write to memory and read data awaiting return to the source of the memory operation. In some embodiments, memory controller 22 may include a memory cache to store recently accessed memory data. In SoC implementations, for example, the memory cache may reduce power consumption in the SoC by avoiding repetitive access of data from memory 12 if it is expected to be accessed again soon. In some cases, the memory cache may also be referred to as a system cache, as opposed to private caches such as the L2 cache or caches in the processors, which serve only certain components. Additionally, in some embodiments, a system cache need not be located within memory controller 22.

Peripherals 18A-18B may be any set of additional hardware functionality included in SoC 10. For example, peripherals 18A-18B may include video peripherals such as an image signal processor configured to process image capture data from a camera or other image sensor, display controllers configured to display video data on one or more display devices, graphics processing units (GPUs), video encoder/decoders, scalers, rotators, blenders, etc. The peripherals may include audio peripherals such as microphones, speakers, interfaces to microphones and speakers, audio processors, digital signal processors, mixers, etc. The peripherals may include interface controllers for various interfaces external to SoC 10 (e.g. the peripheral 18B) including interfaces such as Universal Serial Bus (USB), peripheral component interconnect (PCI) including PCI Express (PCIe), serial and parallel ports, etc. The peripherals may include networking peripherals such as media access controllers (MACs). Any set of hardware may be included.

Clock gen 24 may include one or more clock sources used by components of SoC 10. Types of clock sources included in clock gen 24 may include, for example, any combination of a phase-locked loop (PLL), a frequency-locked loop (FLL), a delay-locked loop (DLL), a crystal oscillator, and an internal oscillator. In addition, clock gen 24 may include frequency multipliers and/or dividers. Some of these elements of clock gen 24 may use initialization information to improve performance, improve accuracy, or select a default frequency. For example, using initialization information may improve the accuracy of a frequency of a crystal oscillator circuit. Another example may be using initialization information to set initial values for frequency multipliers and dividers associated with a PLL to establish a default frequency for the PLL output.

In some embodiments, one or more clock sources in clock gen 24 may remain active in reduced power modes to provide a system clock signal to always-on component 16. In such embodiments, initialization information for the always-on clock source may select a comparatively low frequency of a clock source such as a PLL to reduce power when in the reduced power mode. Initialization information may also be used to select a single clock source from multiple available clock sources for always-on component 16, thereby allowing the unselected clock sources to be disabled in reduced power modes.

Fuses 26 may include one or more configuration fuses used for initializing and configuring circuits within SoC 10. Configuration fuses in a semiconductor device may allow for data to be programmed into a device with no other programmable non-volatile memory, such as flash. Fuses are generally one-time programmable, and are therefore suitable for storing data that is not expected to change, but is not known at the time the device is manufactured, such as, for example, oscillator calibration data or memory repair information. Once a fuse has been blown, its value may not be changed. In various embodiments, a blown fuse may represent a logic high or logic low value depending on the design of the fuse. The configuration fuses may be programmed during a factory test of SoC 10, during assembly of a system of which SoC 10 is a component, during testing of a finished product, or at any other suitable time.

Initialization information may be stored in fuses 26 for one or more circuits within SoC 10 and may also store information for circuits external to SoC 10, such as, for example, information for memory 12. One or more fuses may store initialization information for one circuit. In other embodiments, multiple fuses may be grouped together to encode information for more than one circuit. For example, four fuses may be read together to produce one of sixteen values. Two or more circuits may be configured depending on which of the sixteen values have been programmed into the four fuses. In some embodiments, fuses 26 may be the only available programmable non-volatile memory internal to SoC 10. Since initialization information may be stored in the fuses, fuses 26 may be one of the first memories to be powered on and accessed in SoC 10. In some embodiments, fuses 26 may be read by a processor 30 in CPU complex 14 or by a processor in always-on component 16. In other embodiments, one or more fuses in fuses 26 may be coupled to the circuit to be initialized such that a state of the fuse configures the circuit directly and does not require reading by a processor.

Communication fabric 27 may be any communication interconnect and protocol for communicating among the components of SoC 10. Communication fabric 27 may be bus-based, including shared bus configurations, cross bar configurations, and hierarchical buses with bridges. Communication fabric 27 may also be packet-based, and may be hierarchical with bridges, cross bar, point-to-point, or other interconnects.

PMGR 32 may be configured to control the supply voltage magnitudes requested from PMU 15. There may be multiple supply voltages generated by PMU 15 for SoC 10. For example, illustrated in FIG. 1 are a $V_{CPU}$ and a $V_{SOC}$. The $V_{CPU}$ may be the supply voltage for CPU complex 14. The $V_{SOC}$ may generally be the supply voltage for the rest of SoC 10 outside of CPU complex 14. For example, there may be separate supply voltages for the memory controller power domain and the always-on power domain, in addition to the $V_{SOC}$ for the other components. In another embodiment, $V_{SOC}$ may serve memory controller 22, always-on component 16, and the other components of SoC 10 and power gating may be employed based on the power domains. There may be multiple supply voltages for the rest of SoC 10, in some embodiments. In some embodiments, there may also be a memory supply voltage for various memory arrays in CPU complex 14 and/or SoC 10. The memory supply voltage may be used with the voltage supplied to the logic circuitry (e.g. $V_{CPU}$ or $V_{SOC}$), which may have a lower voltage magnitude than that required to ensure robust memory operation. PMGR 32 may be under direct software control (e.g. software may directly request the power up and/or power down of components) and/or may be configured to monitor SoC 10 and determine when various components are to be powered up or powered down.

PMU 15 may generally include the circuitry to generate supply voltages and to provide those supply voltages to other components of the system such as SoC 10, memory 12 ($V_{MEM}$ in FIG. 1), various off-chip peripheral components (not shown in FIG. 1) such as display devices, image sensors, user interface devices, etc. PMU 15 may thus include programmable voltage regulators, logic to interface to SoC 10 and more particularly PMGR 32 to receive voltage requests, etc.

It is noted that the number of components of SoC 10 (and the number of subcomponents for those shown in FIG. 1, such as within CPU complex 14) may vary from embodiment to embodiment. There may be more or fewer of each component/subcomponent than the number shown in FIG. 1.

Figure 2:
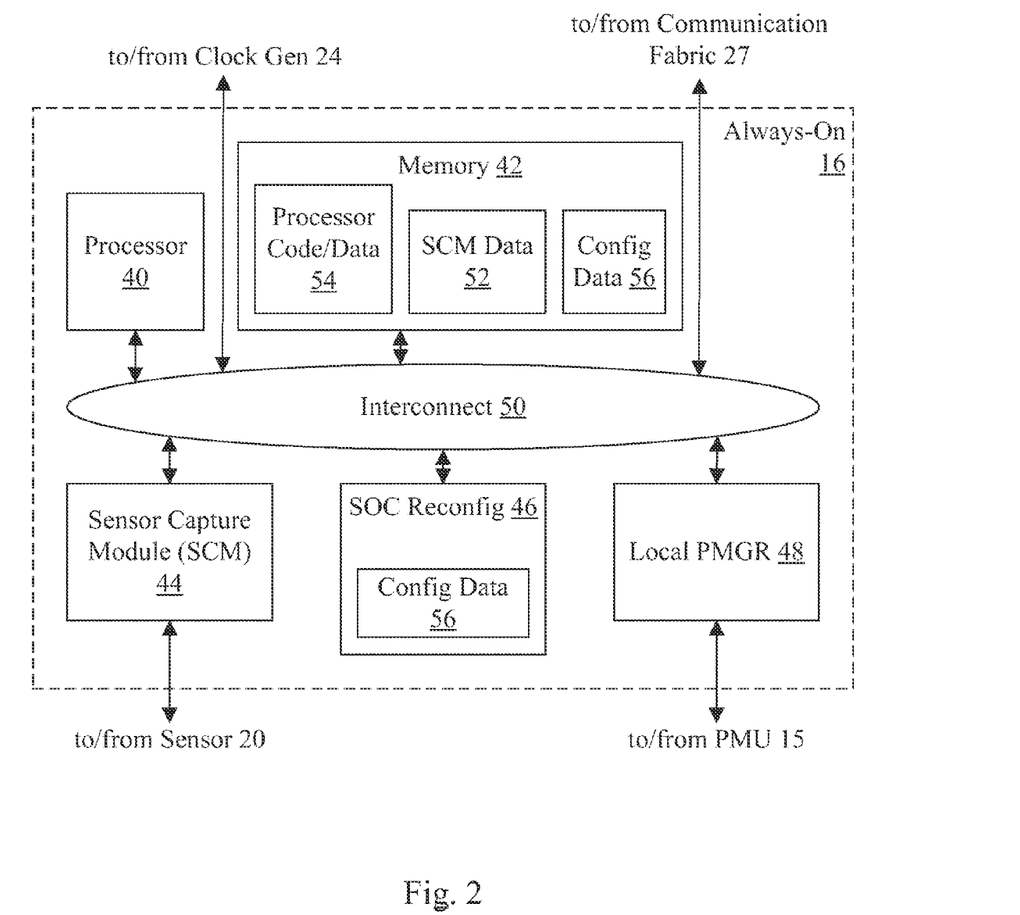
FIG. 2 is a block diagram of one embodiment of an always-on block in the SoC.

Turning now to FIG. 2, a block diagram of one embodiment of always-on component 16 is shown. In the illustrated embodiment, always-on component 16 may include processor 40, memory 42, sensor capture module (SCM) 44, SoC reconfiguration circuit 46, local PMGR 48, and interconnect 50. Processor 40, memory 42, SCM 44, SoC reconfiguration circuit 46, and local PMGR 48 may be coupled to interconnect 50. SCM 44 may also be referred to as a sensor capture unit or a sensor capture circuit.

The sensor capture module 44 may be coupled to sensor 20 when SoC 10 is included in a system, and may be configured to capture data from sensor 20. In the illustrated embodiment, the sensor capture module 44 may be configured to write the captured sensor data, SCM Data 52, to memory 42. Memory 42 may include, for example, an SRAM, a register file, flip-flops, or a combination thereof. However, any suitable type of memory may be used in other embodiments.

SCM data 52 may be stored in locations that are preallocated by always-on component 16 to store captured sensor data. As the locations are consumed, the amount of available memory to store captured data decreases. The sensor capture module 44 may be programmed with a watermark or other indication of fullness in the allocation memory area (generally, e.g., a "threshold"), and the sensor capture module 44 may be configured to wake memory controller 22 to write the captured sensor data to memory 12. Alternatively, processor 40 may be configured to write the captured sensor data to memory 12. In such a case, the sensor capture module 44 may be configured to wake processor 40.

Processor 40 may be configured to execute processor code/data 54 stored in memory 42. Processor code/data 54 may include a series of instructions which, when executed, cause processor 40 to implement various functions. For example, processor code/data 54 may include filter code which may be executed by processor 40 to filter SCM data 52, as discussed above. Responsive to detecting a desired pattern or other data attribute(s) in SCM data 52, processor 40 may be configured to wake memory controller 22 to update memory 12 and/or to wake SoC 10.

Processor code/data 54 may be initialized upon boot of a device including SoC 10. Processor code/data 54 may be stored in a non-volatile memory on SoC 10 or elsewhere in the device, and may be loaded into memory 42, for example. A local non-volatile memory such as read-only memory (ROM) may also be used in some embodiments.

In an embodiment, processor 40 may be a smaller, more power efficient processor than CPU processors 30 in CPU complex 14. Thus, processor 40 may consume less power when active than CPU processors 30 consume. There may also be fewer processors 40 than there are CPU processors 30, in an embodiment.

SoC reconfiguration circuit 46 may be configured to store the programmable configuration data 56 for memory controller 22 and other components of SoC 10, to reprogram various components responsive to powering the components back up from a powered off state. Alternatively, configuration data 56 may be stored in memory 42, or in a combination of memory 42 and SoC reconfiguration circuit 46. Configuration data 56 may be written to the circuit 46 by CPU processors 30, e.g. as part of programming the corresponding component. That is, CPU processors 30 (executing operating system software, for example, as part of the boot of the device and/or at other times when the configuration is changed) may write configuration data 56 to SoC reconfiguration circuit 46. Alternatively, in some embodiments, SoC reconfiguration circuit 46 may have hardware that monitors and shadows a state of configuration of memory controller 22 and the other components of SoC 10. In some embodiments, at least a portion of configuration data 56 may be predetermined and may be stored in a non-volatile memory such as fuses 26 in FIG. 1, rather than being written to memory 42 and/or SoC reconfiguration circuit 46.

In an embodiment, SoC reconfiguration circuit 46 may include logic circuitry configured to process configuration data 56 and to write the data to corresponding components in SoC 10 after SoC 10 is powered up again. Configuration data 56 may include a series of register addresses to be written and the data to write to those registers. In some embodiments, the programmable configuration data 56 may further include read commands to read registers, e.g. polling for an expected value that indicates that the initialization performed by various writes is complete and/or the corresponding state is in effect in the component. The expected value may be the entire value read, or may be a portion of the value (e.g. the expected value may include a value and a mask to be applied to the read value prior to comparison). In some embodiments, configuration data 56 may further include read-modify-write commands to read registers, modify a portion of the read data, and write the modified data back to the register. For example, a second mask may be used to determine which portion of the register value is to be updated. The portion of the register masked by the second mask may not be updated when the value is written to the register.

In another embodiment, SoC reconfiguration circuit 46 may include another processor and corresponding memory storing code for the processor (or the code may also be stored in memory 42). The code, when executed by the processor, may cause the processor to configure the various components in SoC 10 with configuration data 56. The code may implement the polling features described above as part of the structure of the code itself, or configuration data 56 may store the address to poll and the expected value, similar to the above discussion. In another embodiment, processor 40 may execute software to reprogram the components of SoC 10.

Configuration data 56 may include data for memory controller 22, separate data for other components of SoC 10, and separate data for the reconfiguring processor 40 when it is powered up. When powering up memory controller 22 while the remainder of SoC 10 is powered down, the data for memory controller 22 may be processed. The data may include the data from configuration data 56 for memory controller 22. The data may further include additional configuration data, in an embodiment. For example, configuration data may be included for communication fabric 27, sensor 20, or clock gen 24. Configuration data may be included for whichever components are used in communication between always-on component 16 and memory controller 22. When powering up the remainder of SoC 10, the data for the other components may be processed. Similarly, when powering up processor 40, data from configuration data 56 for processor 40 may be processed.

In some embodiments, SoC reconfiguration circuit 46 may be configured to provide configuration data 56 to components of SoC 10 at more than one point in the power up of SoC 10. For example, some data from configuration data 56 may be provided near the beginning of the transition to the powered-on state (e.g., shortly after the power supply voltage is stable), and other data from configuration data 56 may be provided nearer the end of the transition to the powered-on state. Furthermore, in some embodiments, configuration data 56 may be only a portion of the programmable configuration to be established in the components of SoC 10. The remainder of the programmable configuration may be stored in memory 12. For example, operating system software executing on the CPU processors 30 may capture the programmable configuration in memory 12 prior to powering down. The restoration of programmable configuration data stored in memory 12 may be performed by SoC reconfiguration circuit 46, other hardware, and/or the operating system software after the CPU processors 30 have been released from reset and begin execution again.

Local PMGR 48 may be configured to handle power management functions within always-on component 16, in a manner similar to PMGR 32 in FIG. 1 for SoC 10 as a whole. The always-on component 16 may support multiple power states, and local PMGR 48 may assist with transitions between those states. Local PMGR 48 may be configured to communicate with PMU 15 to support state changes, as well as to manage the providing of supply voltages to various components of SoC 10 as part of waking up or putting to sleep various components.

Interconnect 50 may comprise any interconnect to transmit communications between the various subcomponents shown in FIG. 2, as well as to communicate over communication fabric 27 with other components of SoC 10. The interconnect may include any of the examples of communication fabric 27 discussed above with regard to FIG. 1, as desired, in various embodiments.

Figure 3:
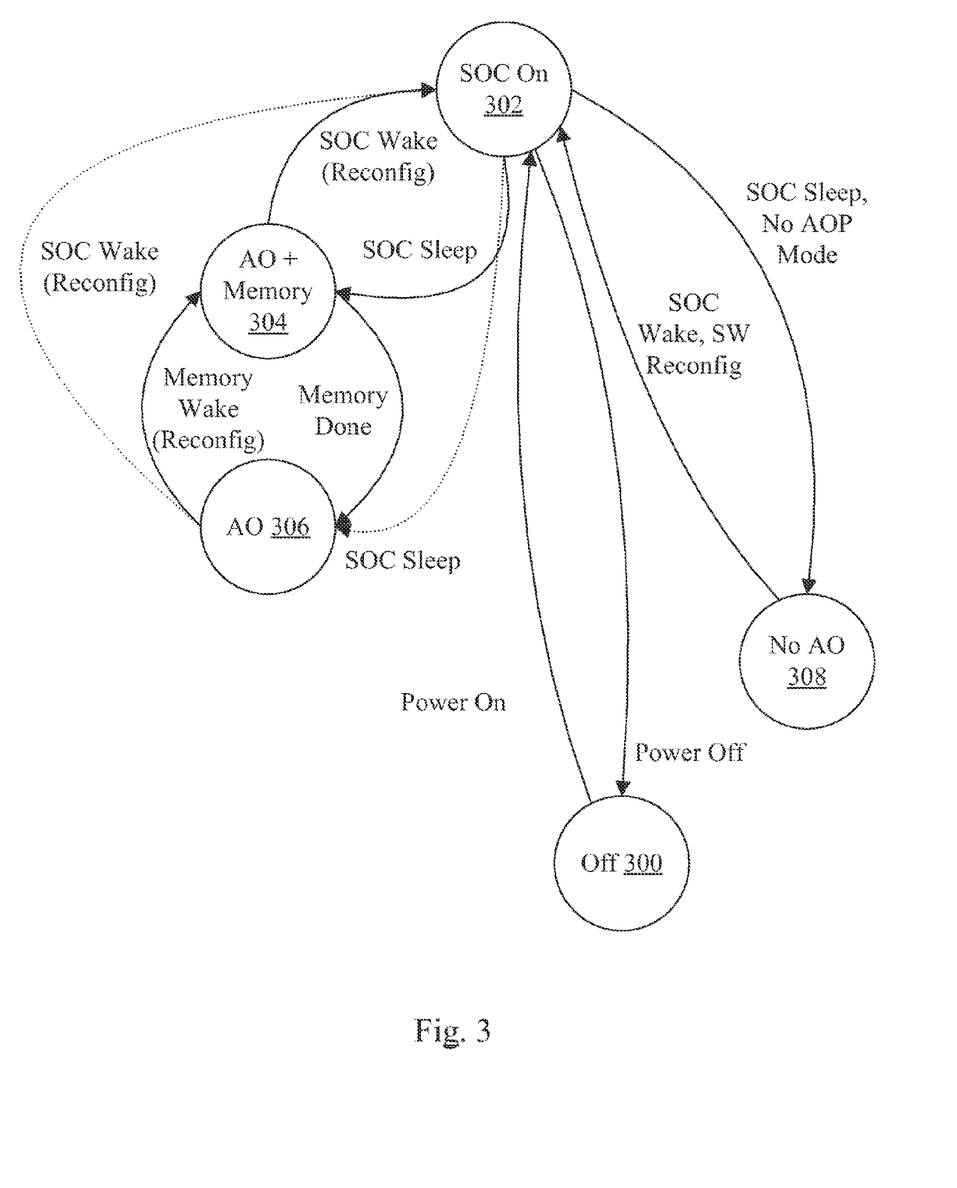
FIG. 3 is a state diagram of one embodiment of a state machine for an always-on block.

Moving on to FIG. 3, a block diagram of a state machine is shown. The state machine of FIG. 3 may be applied to an SoC such as, for example SoC 10 in FIG. 1. In the illustrated embodiment, the state machine includes off state 300, SoC On state 302, AO+memory state 304, AO state 306, and No AO state 308. AO in this context may be an acronym for "always-on."

Off state 300 may be the state in which all power to SoC 10 is off, such as when the device including SoC 10 is completely off. Accordingly, the state machine may transition from off state 300 (e.g. to SoC On state 302) in response to the power being turned on to SoC 10. A reset of SoC 10 may be performed, and then SoC 10 may proceed to boot. The state machine may transition from SoC On state 302 to off state 300 in response to powering off SoC 10 completely. The power off may occur after software executing on the CPUs 30 has saved any desired state from memory 12 to non-volatile memory, closed down various connections that the device may have (e.g. wireless and/or wired network connections, wireless phone connections, etc.), and otherwise have prepared the device for an orderly shutdown. While the transition is from SoC On state 302 to off state 300 in FIG. 3, transitions from the other states to off state 300 may be supported in other embodiments.

In SoC On state 302, SoC 10 may be in full operation. Various components of SoC 10 may be powered on or powered off as desired, but SoC 10 as a whole may generally be viewed as active in SoC On state 302. For example, operating with a given processor 30 enabled and other processors 30 disabled may still be considered as operating in SoC on state 302.

In SoC On state 302, the software executing on CPU complex 14 may determine that SoC 10 should go to a reduced power state (e.g. sleep). In an embodiment, the software may perform a "suspend to RAM" operation, in which various SoC states are written to memory 12 prior to powering down SoC 10. The memory 12 may be placed in a "self-refresh" mode in which it maintains the memory contents but is not active on the memory interface to memory controller 22. PMGR 32 may communicate power down commands to PMU 15 to cause the power down of the components in SoC 10 other than memory controller 22, the fabric 27 (or portion thereof that is used to communicate between memory controller 22), and always-on component 16. In some embodiments, clock gen 24 may switch to different clock settings that allow communication between SCM 44 and sensor 20, but consumes less power than settings used for SoC on state 302. Alternatively, local PMGR 48 may transmit the power down commands. The state machine may transition to AO+memory state 304. In some embodiments, a transition from SoC On state 302 to AO state 306 may be supported as well. Alternatively, the transition from SoC On state 302 to AO state 306 may pass through AO+memory state 304. That is, if the target state is AO state 306, the transition to AO+memory state 304 may be made, followed by the transition to AO state 306.

In some embodiments, processor 40 may copy initialization information from fuses 26 into memory 42 as at least a portion of SCM data 52 and/or configuration data 56 upon transitioning from SoC on state 302 to AO+memory state 304. In other embodiments, the information in fuses 26 may be copied into memory 42 after transitioning from SoC off state 300 to SoC on state 302. Data from fuses 26 may be copied into memory 42 to allow faster access than reading the data directly from fuses 26. In some embodiments, the data from fuses 26 may be read from components that have already been configured with the data rather than reading fuses 26 directly.

In AO+memory state 304, memory controller 22, clock gen 24 (or a portion providing a clock source to always-on component 16), communication fabric 27 (or a portion coupled to always-on component 16) and always-on component 16 may be active. If an event that causes the SoC to wake up is detected, such as, e.g., SCM data 52 reaching a watermark, the state machine may transition to SoC On state 302. The state machine may power up the other components of SoC 10 via communication with PMU 15 and/or power switches in SoC 10 and reconfiguring the components via SoC reconfiguration circuit 46 and/or from data in memory 12, in various embodiments.

On the other hand, always-on component 16 may determine that memory access is completed and may deactivate memory controller 22 (after placing memory 12 in a retention mode such as self-refresh). Memory controller 22 may be powered down and always-on component 16 may remain powered. Clock gen 24 may be powered off or may switch to different clock settings than what was used in AO+memory state 304. The state machine may transition to AO state 306. If always-on component 16 determines that memory access is desirable again (e.g. due to reaching various thresholds in the SCM data 52 or detecting patterns/attributes via processor 40), the state machine may transition to AO+memory state 304 (powering memory controller 22 and communication fabric 27 and reconfiguring necessary components via SoC reconfiguration circuit 46). In some embodiments, a direct transition from AO state 306 to SoC On state 302 may be supported, including powering up memory controller 22, communication fabric 27, and other components of SoC 10 and reconfiguring those components via SoC reconfiguration circuit 46.

In one embodiment, the No AO state 308 may be supported. The No AO state 308 may be a state in which always-on component 16 is powered down but memory 12 remains powered in retention mode. The No AO state 308 may be similar to a "classic" suspend to RAM state. Returning from the No AO state 308 to SoC On state 302 may include software reconfiguring the components of SoC 10, including always-on component 16. The software may execute on the CPU processors 30. Thus, the transition from the no AO state 308 to SoC On state 302 may include basic boot operations until software has initialized SoC 10 and has detected that memory 12 is storing state already.

It is noted that the state machine of FIG. 3 is merely an embodiment for demonstrative purposes. Other embodiments may have a different number of states and may include different transitions between states.

Figure 4:
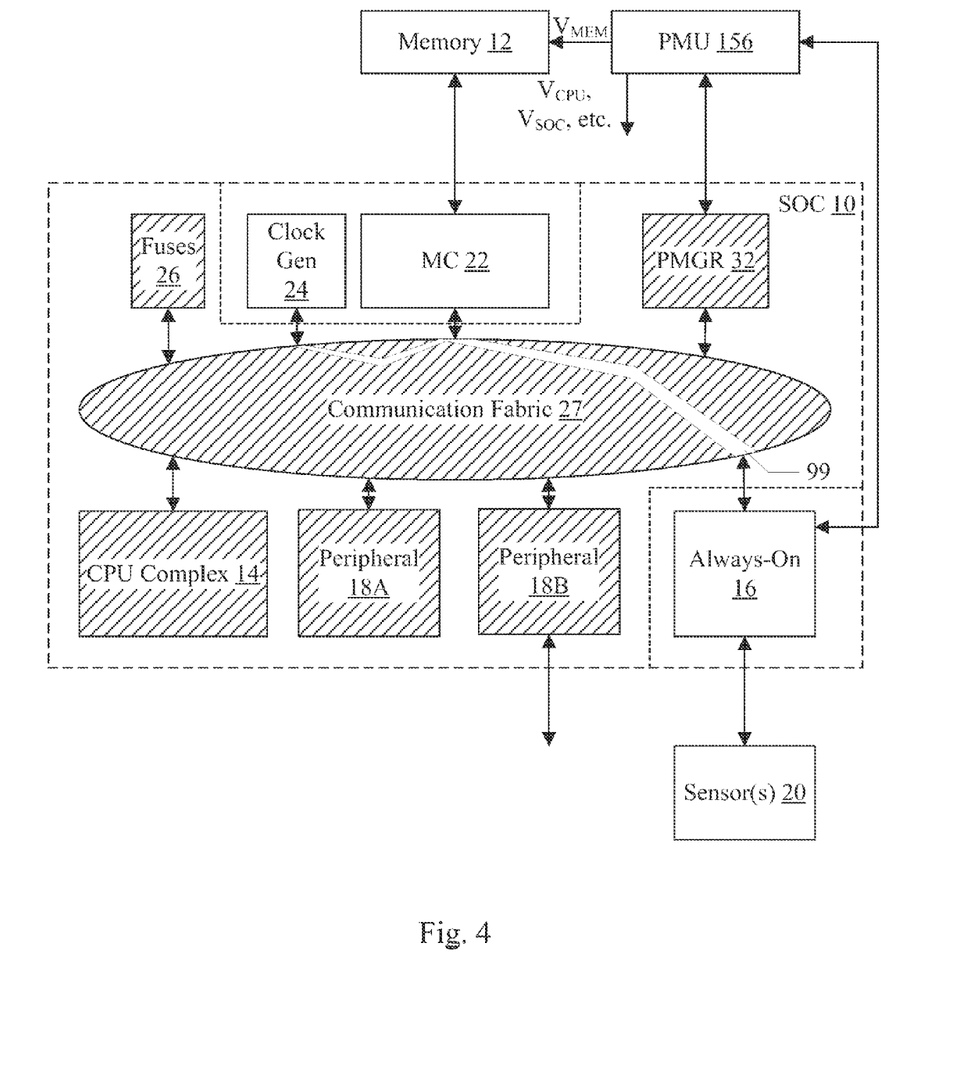
FIG. 4 is a block diagram illustrating one embodiment of the SoC in a first reduced power state.

Turning to FIG. 4, a block diagram is presented that illustrates the components of SoC 10 and which components may be on or off in one embodiment of SoC 10 for AO+memory state 304. The crosshatched components in FIG. 4 may be powered off, while the non-crosshatched components may be powered on.

As illustrated in FIG. 4, memory controller 22, clock gen 24, and always-on component 16 may be powered up while the remaining components are powered down. Additionally, a portion 99 of communication fabric 27 that is used to communicate between always-on component 16, memory controller 22, and clock gen 24 may be powered up while the remainder of communication fabric 27 may be powered down. For example, in an embodiment, communication fabric 27 may include a hierarchical set of buses and circuitry to route transactions from sources such as peripherals 18A-18B, CPU complex 14, and always-on component 16 to memory controller 22. The fabric may also carry data (to memory controller 22 for writes, from memory controller 22 for reads) and responses from memory controller 22 to the sources. The portions of the hierarchical interface and circuitry between always-on component 16, clock gen 24, and memory controller 22 may be powered on and other portions may be powered off.

Figure 5:
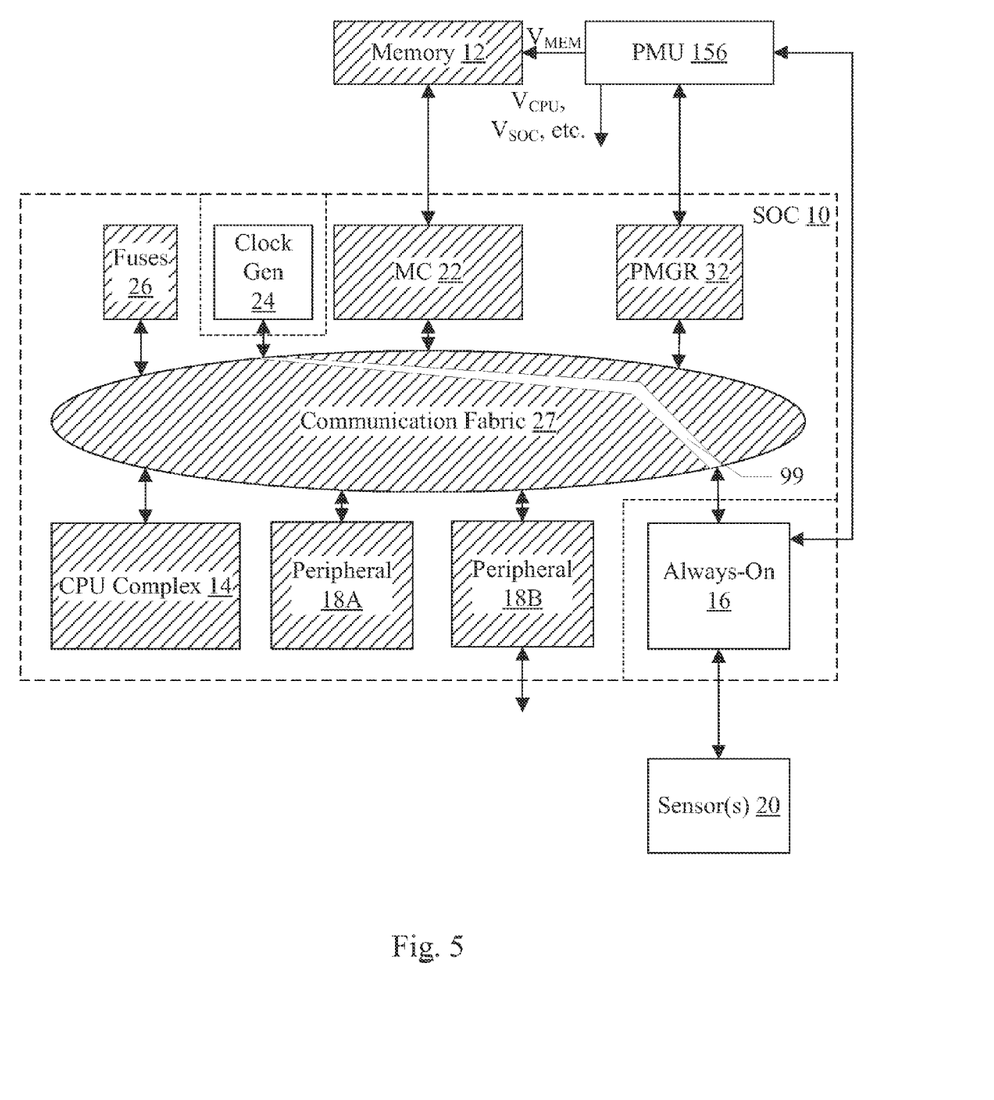
FIG. 5 is a block diagram illustrating one embodiment of the SoC in a second reduced power state.

Similar to FIG. 4, FIG. 5 illustrates a block diagram showing components of SoC 10 and which components may be on or off in one embodiment of SoC 10 for AO state 306. The crosshatched components in FIG. 5 may be powered off, while the non-crosshatched components may be powered on.

FIG. 5 shows that, in AO state 306, memory controller 22 and memory 12 may be disabled. Always on processor 16 and clock gen 24 may remain powered. To disable memory 12, memory controller 22 may put memory 12 into the self-refresh mode such that memory contents are retained. After placing memory 12 into the self-refresh mode, memory controller 22 may be powered down. Hierarchal portions of communication fabric 27 used to connect memory controller 22 to always on component 16 may also be disabled, leaving the portions necessary for always on processor 16 to communicate with clock gen 24. In some embodiments, always on processor may include an alternate clock source separate from clock gen 24 and may use this alternate clock source, allowing clock gen 24 to be powered down. In such an embodiment, the portion of communication fabric 27 supporting communications between always on component 16 and clock gen 24 may also be disabled, It is noted that the block diagrams of FIG. 4 and FIG. 5 are examples for demonstrating the disclosed concepts. In various other embodiments, different combinations of SoC 10 components may be left enabled or powered down in the AO+memory state 304 and AO state 306.

Figure 6:
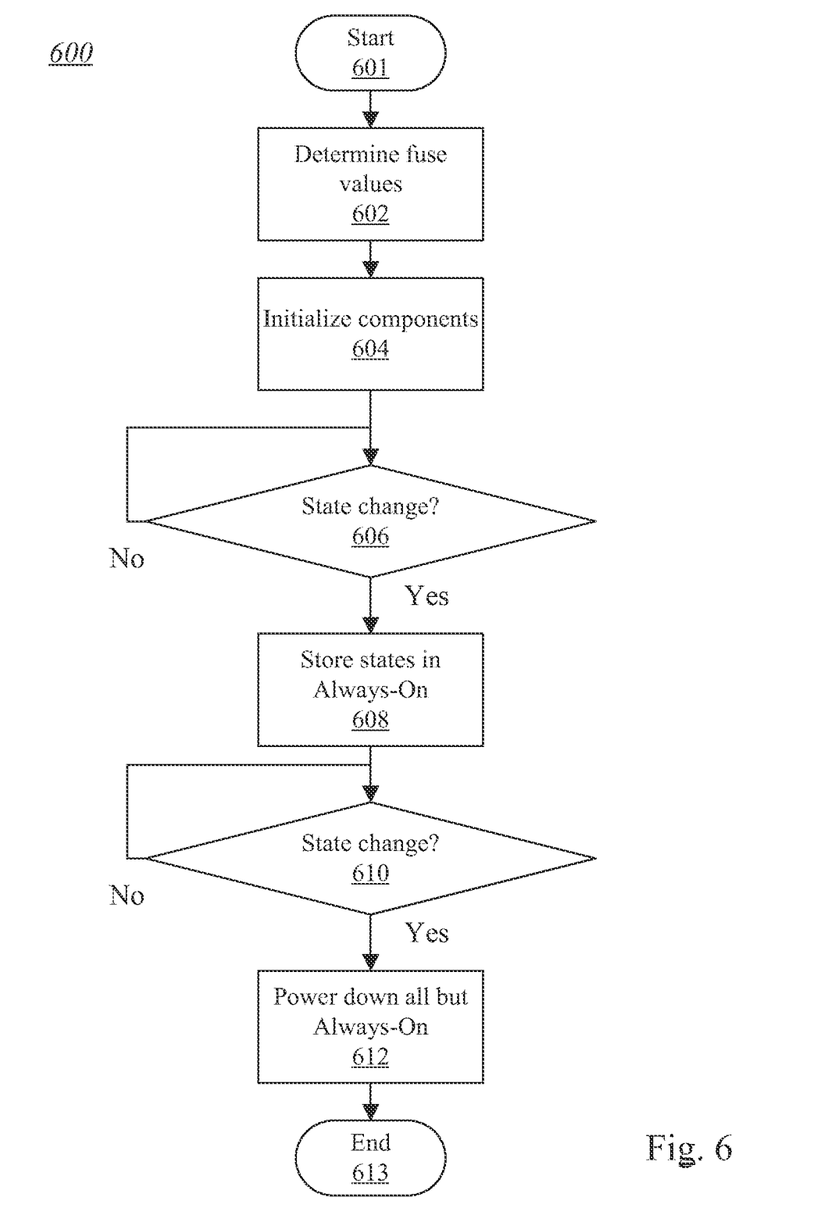
FIG. 6 is a flowchart illustrating a method for initializing circuits as part of a mode transition.

Turning next to FIG. 6, a flowchart is presented to illustrate a method for initializing circuits as part of a mode transition. Method 600 may be used in conjunction with an SoC, such as, for example, SoC 10 in FIG. 1, to move between operational states such as presented in FIG. 3. Referring collectively to SoC 10 in FIG. 1, FIG. 3 and FIG. 6, the method may begin with action 601.

Upon an initial power up, such as a transition from SoC off state 300 to SoC on state 302, SoC 10 may determine the value of one or more fuses in fuses 26 (action 602). The one or more fuses of fuses 26 may be programmed during a manufacturing or test process to provide configuration information for components within SoC 10. Fuses 26 may also include configuration information for devices external to SoC 10, such as, for example, configuration data for memory 12 or for sensor 20.

A processor within SoC 10, for example, one of processors 30, may use the determined values to initialize components and devices using corresponding fuse values (action 604). In other embodiments, processor 40, in always-on component 16, may use the determined fuse values to initialize components. Components to be initialized may include memory controller 22, any of peripherals 18A-18B, clock gen 24, memory 42 in always-on component 16, and communications fabric 27. External devices that may be initialized with the determined values may include memory 12, PMU 15, and sensor 20.

The method may next depend on a change of operating state (action 606). A processor or a state machine within SoC 10, such as, for example, one of processors 30 or processor 40 in always-on component 16, may request or initiate a state change to a reduced power mode. For example, an operating system running on a processor 30 may monitor a level of activity of one or more components in SoC 10 while operating in SoC on state 302 and request a change to AO+memory state 304 if the activity is below a determined threshold. If a change of state, such as, for example, from SoC on state 302 to AO+memory state 304, has not been requested or initiated, then the method may remain in action 606. Otherwise, if a change of state has been initiated, then the method may move to action 608 to store configuration data for components active in the AO+memory state 304.

In response to an impeding state change, configuration data from fuses 26 may be stored in always-on component 16 (action 608). Referring to FIG. 3, data may be stored in memory 42 or in a local memory in SoC reconfiguration circuit 46. In some embodiments, all configuration data from fuses 26 may be stored in always-on component 16, while in other embodiments, configuration fuse data may be saved only for components and devices active in the new state (i.e., AO+memory state 304) such as, for example, the components associated with the unshaded blocks of FIG. 4.

The configuration data may be read directly from fuses 26, which may create a consistent default state since data stored in fuses 26 may not change. In such embodiments, when the stored configuration data is used to initialize the corresponding components, these components may be reset to a known, default state. In other embodiments, the configuration data may be read from the components that use the configuration data. In such embodiments, one or more values from fuses 26 may be overwritten during operation of the component, such that when the components are re-initialized with the stored configuration data, they will be set to the last operating configuration. In some embodiments, the configuration data from fuses 26 may be saved before the request to change state. For example, upon transitioning from SoC off state 300 to SoC on state 302, as configuration data from fuses 26 is determined and used to initialize components in SoC 10 (e.g., during or after action 604), appropriate configuration data may be saved in memory 42 and/or in a local memory in SoC reconfiguration circuit 46.

The method may next depend on another change of operating state (action 610). Processor 40 in always-on component 16, may request or initiate a state change to a reduced power mode. For example, code running on a processor 40 may monitor a level of activity of an active component in AO+memory state 304, such as, e.g., memory controller 22, and request a change to AO state 306 if current memory operations are determined to be complete. If a change of state has not been requested or initiated, then the method may remain in action 610. Otherwise, if a change of state has been initiated, then the method may move to action 612 to transition to the new state.

SoC 10 may transition from AO+memory state 304 to AO state 306 by powering down components of the memory (action 612). Memory 12 may be powered down by placing it into a self-refresh mode in which data values are retained, but power consumption is reduced by powering off associated read and write logic. Memory controller 22 may be powered down by reducing a level of a supply voltage to it. All or some of clock gen 24 may be powered down if a supplied clock signal is no longer required. For example, clock gen 24 may supply a clock signal for memory controller 22 to interface with memory 12. If memory controller 22 is powered down, then a clock source providing the clock signal may be powered down also if no other components are using that clock signal. The method may end with action 613.

It is noted that, method 600 of FIG. 6 is merely an example. In other embodiments, a different number of actions may be included and the presented actions may be executed in a different order. For example, in other embodiments, action 608 may be executed between action 604 and action 605.

Figure 7:
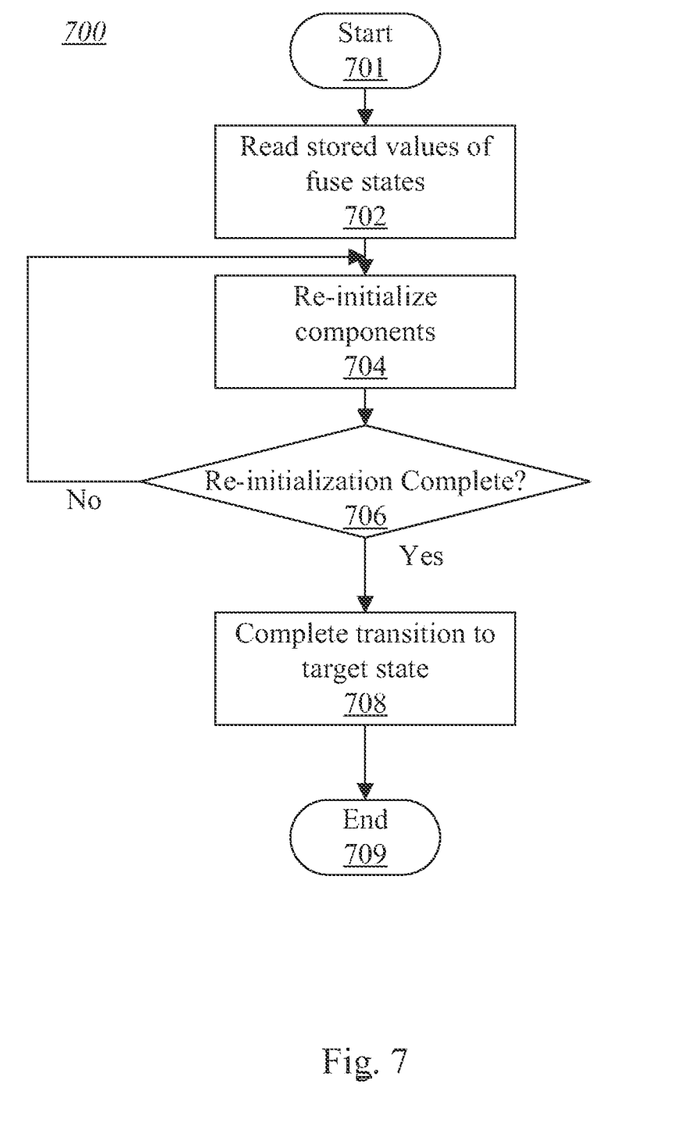
FIG. 7 illustrates a flowchart of an embodiment of a method for reconfiguring circuits as part of a mode transition.

Turning next to FIG. 7, a flowchart is shown illustrating a method for responding to a determination that one or more components of SoC 10 are to be powered up again. Method 700 may be used in conjunction with an SoC, such as, for example, SoC 10 in FIG. 1, to move between operational states such as presented in FIG. 3, such as transitioning from AO state 306 to AO+memory state 304. Method 700 may be performed subsequent to performing method 600 of FIG. 6. Referring collectively to SoC 10 in FIG. 1, FIG. 3, FIG. 6, and FIG. 7, the method may begin in action 701.

Stored configuration data may be read from memory (action 702). In response to transitioning from AO state 306 to AO+memory state 304, values stored during the transition from SoC on state 302 to AO+memory state 304, for example, configuration data stored in action 608 of method 600, may be read from memory 42 or from the local memory in SoC reconfiguration circuit 46. The data read from these memories may be the same data as is programmed into fuses 26. Reading the configuration data from memory 42 or from SoC reconfiguration circuit 46 may provide a faster access to the configuration compared to reading the same data from fuses 26. In other embodiments, the configuration data stored in memory 42 or in SoC reconfiguration circuit 46 may include one or more changes in values made during operation of a component corresponding to the changed value.

SoC reconfiguration circuit 46 may use the configuration data to re-initialize components that were powered down in AO state 306 but are active in AO+memory state 304 (action 704). Components returning to an active mode from a powered down mode, such as, for example, memory controller 22, memory 12, and clock gen 24, may have lost configuration data when then were powered down. In some embodiments, as part of a power down process, a level of a supply voltage to these components may be reduced to a level that register bits used to retain configuration data may not operate reliably and therefore might lose their values. In such embodiments, components coming out of such a power down condition may require re-initialization to return to a proper operating state.

The method may depend on the re-initialization being complete (action 706). SoC reconfiguration circuit 46 may re-initialize each component one at a time. Each component may have more than one register requiring re-initialization. SoC reconfiguration circuit 46, therefore, may require multiple cycles of a supplied clock signal in order to complete. If the re-initialization is not complete, then the method may return to action 704 to continue to initialize components. Otherwise, the method may move to action 708 to complete the state transition.

In response to completing re-initialization of the components, the transition to the new state, e.g., AO+memory state 304, may complete (action 708). Completion of the transition to AO+memory state 304 may include setting a value of one or more status bits which may allow for processor 40 or SCM 44 to access memory 12 through memory controller 22. Setting the value of the one or more status bits may also signal clock gen 24 to re-enable a previously disabled clock signal. Once the transition to AO+memory state 304 is complete, the method may end in action 709.

It is noted that, method 700 illustrated in FIG. 7 is merely an example for demonstrating the disclosed concepts. In other embodiments, actions may be executed in a different order or a different number of actions may be included.

Figure 8:
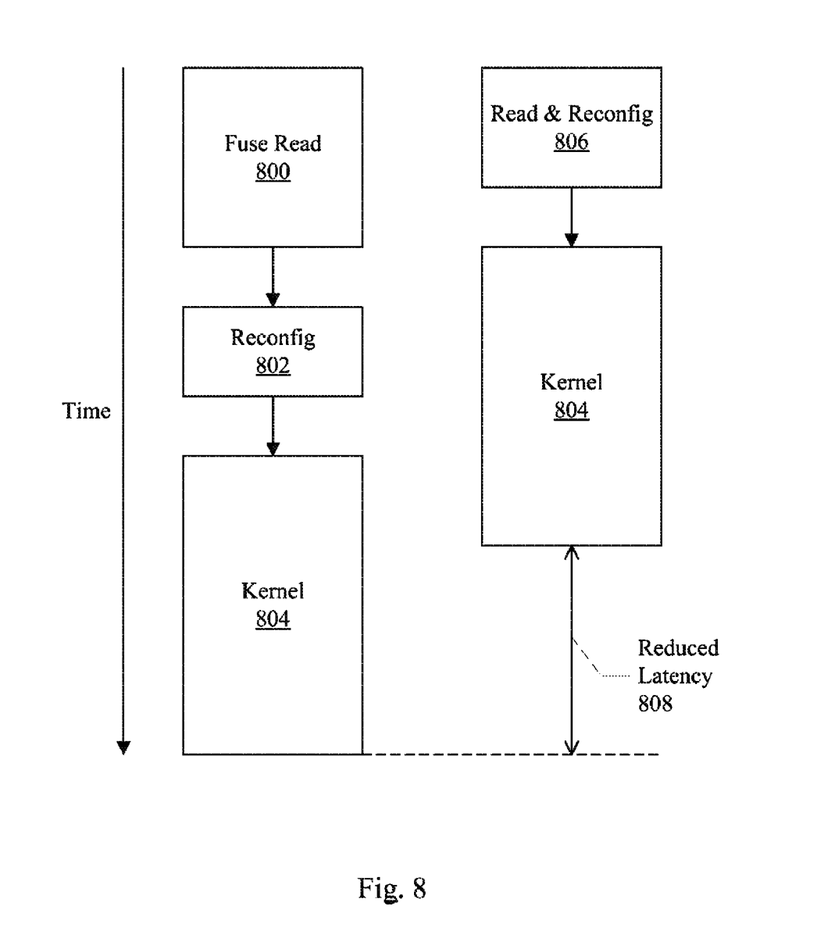
FIG. 8 is a diagram illustrating latency reduction for one embodiment using the reconfiguration approach.

FIG. 8 is a timing diagram illustrating latency reduction between two reconfiguration processes during a state transition, such as from AO state 306 to AO+memory state 304 as illustrated in FIG. 3. Each rectangle may represent a time period for executing a particular task, larger blocks corresponding to longer time periods. On the left is an always-on boot sequence for SoC 10 in FIG. 1, in which configuration data is stored only in fuses 26. On the right is a reconfiguration process for SoC 10 according to method 700 in FIG. 7. Time increases from top to bottom in FIG. 8, as illustrated by the arrow on the left hand side of FIG. 8.

The always-on boot sequence may be performed when a device including SoC 10 transitions from AO state 306 in which memory controller 22 and memory 12 may be powered down into AO+memory state 304 in which memory controller 22 and memory 12 may be powered up to support memory accesses. In time period 800, configuration data is read from the fuses, requiring time for fuses 26 to be powered for the read and for any sensing circuitry to perform the read. Once the configuration data has been read, then, in time period 802, components being activated in AO+memory state 304 (e.g., memory 12, memory controller 22, portions of communication fabric 27 and/or clock gen 24) are configured using the read configuration data. In some embodiments, the activated components may be the same for every AO state 306 to AO+memory state 304 transition. In other embodiments, components to be activated may be determined by the software kernel running on processor 40 in always-on component 16. Once the activated components are re-configured, then the software kernel may perform its required tasks in time period 804, after which, SoC 10 may transition back to AO state 306.

By comparison, if configuration data is stored in memory 42 or SoC reconfiguration circuit 46 of always-on component 16, then, in time period 806, to transition from AO state 306 to AO+memory state 304, the configuration data may be read from these already active memories and used to configure the activating components, as described in time period 802. Reading from the already active memory 42 or SoC reconfiguration circuit 46 may require less time than reading the configuration data from fuses 26, allowing kernel software 804 to execute sooner. Reduced latency 808 highlights the difference in time that reading the configuration data from memory in always-on component 16 may provide. In some embodiments, a transition from AO state 306 to AO+memory state 304 may occur frequently, resulting in a cumulative time savings which may result in a corresponding power savings. Additionally, by requiring fewer accesses to fuses 26, the fuses may be subjected to fewer read cycles which may result in less stress on the fuse circuits and potentially result in increased reliability.

It is noted that the time-line of FIG. 8 is merely an example. Other embodiments may include additional tasks. Proportions of the included time periods are sized for communicating the presented concepts and may not reflect actual relative time periods.

Numerous variations and modifications will become apparent to those skilled in the art once the above disclosure is fully appreciated. It is intended that the following claims be interpreted to embrace all such variations and modifications.

What is claimed is:

1. An apparatus, comprising:
a plurality of circuit blocks;
a plurality of fuses; and
circuitry configured to:
   determine a state for each fuse of the plurality of fuses responsive to transitioning from an off mode to a first operating mode, wherein a first number of circuit blocks of the plurality of circuit blocks are enabled in the first operating mode;
   initialize the first number of circuit blocks utilizing the states of one or more fuses of the plurality of fuses;
   transition from the first operating mode to a second operating mode, wherein a second number of circuit blocks of the plurality of circuit blocks are enabled in the second operating mode, and wherein the second number is less than the first number;
   store fuse data in a first memory, wherein the fuse data is representative of the states of a subset of the plurality of fuses, wherein the subset of the plurality of fuses corresponds to the second number of circuit blocks, and wherein the first memory is enabled in the second operating mode;
   transition from the second operating mode to a third operating mode, wherein the first memory retains the stored fuse data in the third operating mode, including fuse data utilized for initializing at least a subset of the second number of circuit blocks that are powered down in the third operating mode;
   transition from the third operating mode back to the second operating mode; and
   calibrate at least one circuit block of the subset of the second number of circuit blocks using at least a portion of the stored fuse data in response to transitioning from the third operating mode to the second operating mode.

2. The apparatus of claim 1, wherein the at least one circuit block of the subset of the second number of circuit blocks includes a communication bus.

3. The apparatus of claim 1, wherein at least two circuit blocks of the plurality of circuit blocks comprise a second memory, and wherein the at least one circuit block of the subset of the second number of circuit blocks includes a subset of a plurality of memory arrays included in the second memory.

4. The apparatus of claim 3, wherein at least a portion of the stored fuse data includes data associated with repairing the subset of the plurality of memory arrays.

5. The apparatus of claim 1, wherein the at least one circuit block of the subset of the second number of circuit blocks includes at least one sensor.

6. The apparatus of claim 1, wherein the at least one circuit block of the subset of the second number of circuit blocks includes a clock source.

7. The apparatus of claim 1, wherein the circuitry is further configured to:
   execute a software kernel while in the third operating mode; and
   select the at least one circuit block dependent upon the software kernel.

8. A method comprising:
determining a state for each fuse of a plurality of fuses responsive to transitioning from an off mode to a first operating mode, wherein a first number of circuit blocks of a plurality of circuit blocks are enabled in the first operating mode;
initializing the first number of circuit blocks utilizing the states of one or more fuses of the plurality of fuses;
transitioning from the first operating mode to a second operating mode, wherein a second number of circuit blocks of the plurality of circuit blocks are enabled in the second operating mode, and wherein the second number is less than the first number;
storing fuse data in a first memory, wherein the fuse data is representative of the state of a subset of the plurality of fuses, wherein the subset of the plurality of fuses corresponds to the second number of circuit blocks, and wherein the first memory enabled in the second operating mode;
transitioning from the second operating mode to a third operating mode, wherein the first memory retains the stored fuse data in the third operating mode, including fuse data utilized for initializing at least a subset of the second number of circuit blocks that are powered down in the third operating mode;
transitioning from the third operating mode back to the second operating mode; and
calibrating at least one circuit block of the subset of the second number of circuit blocks utilizing at least a portion of the stored fuse data in response to transitioning from the third operating mode to the second operating mode.

9. The method of claim 8, wherein the at least one circuit block of the subset of the second number of circuit blocks includes a communication bus.

10. The method of claim 8, wherein at least two circuit blocks of the plurality of circuit blocks comprise a second memory, and wherein the at least one circuit block of the subset of the second number of circuit blocks includes a subset of a plurality of memory arrays included in the second memory.

11. The method of claim 10, wherein at least a portion of the stored fuse data includes data associated with repairing the subset of the plurality of memory arrays.

12. The method of claim 8, wherein the at least one circuit block of the subset of the second number of circuit blocks includes at least one sensor.

13. The method of claim 8, wherein the at least one circuit block of the subset of the second number of circuit blocks includes a clock source.

14. The method of claim 8, further comprising:
   executing a software kernel while in the third operating mode; and
   selecting the at least one circuit block dependent upon the software kernel.

15. A system comprising:
at least one sensor; and
a processor including a plurality of fuses and a memory, wherein the processor is configured to:

determine a state for each fuse of the plurality of fuses responsive to transitioning from an off mode to a first operating mode;

calibrate the at least one sensor utilizing the states of a first subset of the plurality of fuses;

transition from the first operating mode to a second operating mode, wherein the memory remains enabled in the second operating mode;

store fuse data in the memory, wherein the fuse data is representative of the state of a second subset of the plurality of fuses, and wherein the second subset includes the first subset;

transition from the second operating mode to a third operating mode, wherein the memory retains the stored fuse data in the third operating mode, including the fuse data utilized for initializing the at least one sensor, and wherein the at least one sensor is powered down in the third operating mode;

transition from the third operating mode back to the second operating mode; and calibrate the at least one sensor utilizing a portion of the stored fuse data representative of the state of the first subset of the plurality of fuses.

16. The system of claim 15, wherein to store fuse data in the memory, the processor is further configured to read the states of the first subset of the plurality of fuses from the at least one sensor.

17. The system of claim 15, further comprising a system memory, wherein the second subset of the plurality of fuses includes data associated with repairing a portion of the system memory.

18. The system of claim 15, wherein the processor is further configured to initialize a communication bus utilizing another portion of the stored fuse data in response to transitioning from the third operating mode to the second operating mode.

19. The system of claim 15, wherein the processor is further configured to calibrate a clock source utilizing another portion of the stored fuse data in response to transitioning from the third operating mode to the second operating mode.

20. The system of claim 15, wherein the processor is further configured to:
execute a software kernel while in the third operating mode; and
select the at least one sensor for initialization dependent upon the software kernel.

* * * * *